US011925079B2

(12) United States Patent
Qiu et al.

(10) Patent No.: US 11,925,079 B2
(45) Date of Patent: Mar. 5, 2024

(54) DISPLAY PANEL AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Yuanyou Qiu, Beijing (CN); Yao Huang, Beijing (CN); Weiyun Huang, Beijing (CN); Binyan Wang, Beijing (CN); Zhi Wang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 435 days.

(21) Appl. No.: 17/364,659

(22) Filed: Jun. 30, 2021

(65) Prior Publication Data
US 2022/0102466 A1 Mar. 31, 2022

(30) Foreign Application Priority Data
Sep. 28, 2020 (CN) .......................... 202011043261.3

(51) Int. Cl.
*H01L 21/00* (2006.01)
*H10K 50/822* (2023.01)
*H10K 59/122* (2023.01)
*H10K 59/131* (2023.01)

(52) U.S. Cl.
CPC ......... *H10K 59/131* (2023.02); *H10K 50/822* (2023.02); *H10K 59/122* (2023.02)

(58) Field of Classification Search
CPC .................................................. H10K 59/131
See application file for complete search history.

(56) References Cited

U.S. PATENT DOCUMENTS

| 2004/0041753 | A1* | 3/2004 | Nakanishi | G09G 3/3233 345/76 |
| 2012/0092017 | A1* | 4/2012 | Qiu | G02F 3/00 313/505 |
| 2019/0363156 | A1* | 11/2019 | Ohara | H10K 59/123 |
| 2021/0193776 | A1* | 6/2021 | Wang | H10K 50/82 |
| 2022/0393085 | A1* | 12/2022 | Cheng | G06F 3/0412 |

* cited by examiner

*Primary Examiner* — Douglas M Menz
(74) *Attorney, Agent, or Firm* — IPro, PLLC

(57) ABSTRACT

A display panel, includes: a substrate; and a plurality of OLED devices disposed on the substrate, each of which includes an anode and a light-emitting layer arranged in stack; further includes a patterned area, the patterned area comprising at least one cathode group, each of which includes a plurality of cathodes arranged at intervals, and an orthographic projection of each of the plurality of cathodes on the substrate at least covers an orthographic projection of the light-emitting layer of one of the plurality of OLED devices on the substrate; and for each of the at least one cathode group, the display panel further includes a plurality of first wirings electrically connected to the plurality of cathodes in one-to-one correspondence and a second wiring electrically connected to the plurality of first wirings and electrically connected to a VSS signal line. A display device is further provided.

20 Claims, 5 Drawing Sheets

DISPLAY PANEL AND DISPLAY DEVICE

CROSS REFERENCES TO RELATED APPLICATIONS

This disclosure claims the priority of Chinese patent application CN 202011043261.3 entitled "Display Panel And Display Device" and filed with National Intellectual Property Administration, P. R. C. on Sep. 28, 2020, contents of which is incorporated herein by reference in entirety for all purpose.

TECHNICAL FIELD

Embodiments of the present disclosure relate to a display panel and a display device.

BACKGROUND

Organic Electro Luminesecent Display (OLED) panel has gradually become the mainstream of the display field due to its low power consumption, high color saturation, wide viewing angle, small thickness, and flexibility, etc., and can be widely used in terminal products such as smart phones, tablet computers, TVs, and etc.

However, a light transmittance of the OLED display panel is still required to be further improved, especially in the application of the under-screen camera. Due to a poor light transmittance, OLED display panels are not conducive to guarantee a good shooting effect of the under-screen camera.

SUMMARY

At least one embodiment of the present disclosure provides a display panel including: a substrate; and a plurality of OLED devices disposed on the substrate, each of the plurality of OLED devices comprising an anode and a light-emitting layer arranged in stack; wherein the display panel further comprises a patterned area, the patterned area comprising at least one cathode group, each of the at least one cathode group comprising a plurality of cathodes arranged at intervals, and an orthographic projection of each of the plurality of cathodes on the substrate at least covers an orthographic projection of the light-emitting layer of one of the plurality of OLED devices on the substrate; and for each of the at least one cathode group, the display panel further comprises a plurality of first wirings and a second wiring, the plurality of first wirings are electrically connected to the plurality of cathodes in one-to-one correspondence, and the second wiring is electrically connected to the plurality of first wirings and electrically connected to a VSS signal line.

In an embodiment of the present disclosure, the plurality of cathodes of each of the at least one cathode group are arranged in a row or a column.

In an embodiment of the present disclosure, the display panel further includes a non-patterned area, the non-patterned area comprises a plate cathode, and the second wiring extends from the patterned area to the non-patterned area and is electrically connected to the plate cathode.

In an embodiment of the present disclosure, the display panel further includes a first display area, a second display area, and a third display area, the first display area disposed around the second display area, and the third display area disposed around the first display area; wherein the patterned area is disposed in the second display area, and an under-screen camera is disposed in the patterned area.

In an embodiment of the present disclosure, the first display area includes a first pixel unit provided with a first pixel circuit, and the plurality of OLED devices are disposed in the second display area, and for each of the plurality of OLED devices, the display panel further includes: a third wiring configured to electrically connect a drain electrode of the first pixel circuit and the anode of the OLED device, so as to drive the OLED device to emit light.

In an embodiment of the present disclosure, the third wiring is a transparent wiring, and the second wiring and the third wiring are disposed in same layer.

In an embodiment of the present disclosure, the VSS signal line is located on a middle line of the second display area, the at least one cathode group comprises at least one first cathode group disposed on a first side of the VSS signal line and at least one second cathode group disposed on a second side of the VSS signal line, the second wiring comprises a first portion disposed on the first side of the VSS signal line and a second portion disposed on the second side of the VSS signal line, the first portion comprises a plurality of first branches arranged at intervals in a direction parallel to the VSS signal line, each of the plurality of first branches is electrically connected to the plurality of first wirings corresponding to one of the at least one first cathode group, the second portion comprises a plurality of second branches arranged at intervals in the direction parallel to the VSS signal line, each of the plurality of second branches is electrically connected to the plurality of first wirings corresponding to one of the at least one second cathode group.

In an embodiment of the present disclosure, the display panel further includes a first planarization layer and a second planarization layer, the first planarization layer and the second planarization layer disposed between the substrate and the plurality of OLED devices, wherein the second planarization layer is disposed adjacent to the plurality of OLEDs, the plurality of first wirings and the second wiring are both disposed between the first planarization layer and the second planarization layer, each of the plurality of cathodes is electrically connected to the first wiring via a via hole passing through the second planarization layer.

In an embodiment of the present disclosure, the display panel further includes a pixel definition layer disposed on a surface of the second planarization layer away from the substrate, wherein the pixel definition layer is provided with a plurality of openings, and the plurality of OLED devices are arranged in the plurality of openings in one-to-one correspondence, and at least part of each of the plurality of cathodes covers the surface of the pixel definition layer; a through hole passing through the second planarization layer and the pixel definition layer and at least exposing a part of the surface of the first wiring; and a conductive connection layer disposed in the through hole and contacting and connecting with the first wiring and the cathode respectively.

At least one embodiment of the present disclosure provides a display device.

DETAILED DESCRIPTION OF THE EMBODIMENTS

Embodiments of the present disclosure will be described in detail hereinafter. The embodiments described below are exemplary, and are only used to explain the present disclosure, and should not be construed as a limit to the present disclosure. Where specific techniques or conditions are not indicated in the examples, the procedures shall be carried out in accordance with the techniques or conditions described in the literature in the field or in accordance with the product specification.

At least one embodiment of the present disclosure provides a display panel.

Figure 1:
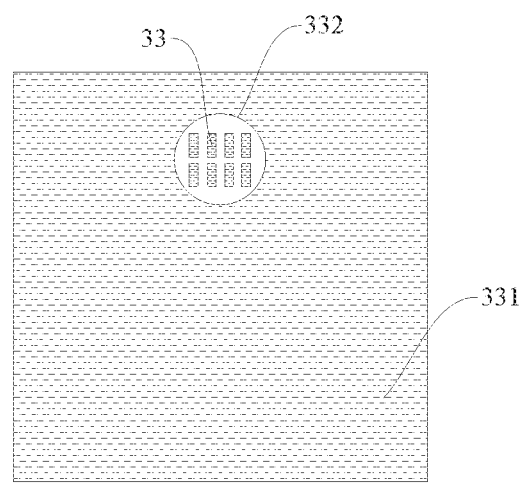
FIG. 1 illustrates a schematic plan view of a cathode according to an embodiment of the present disclosure.
Figure 2:
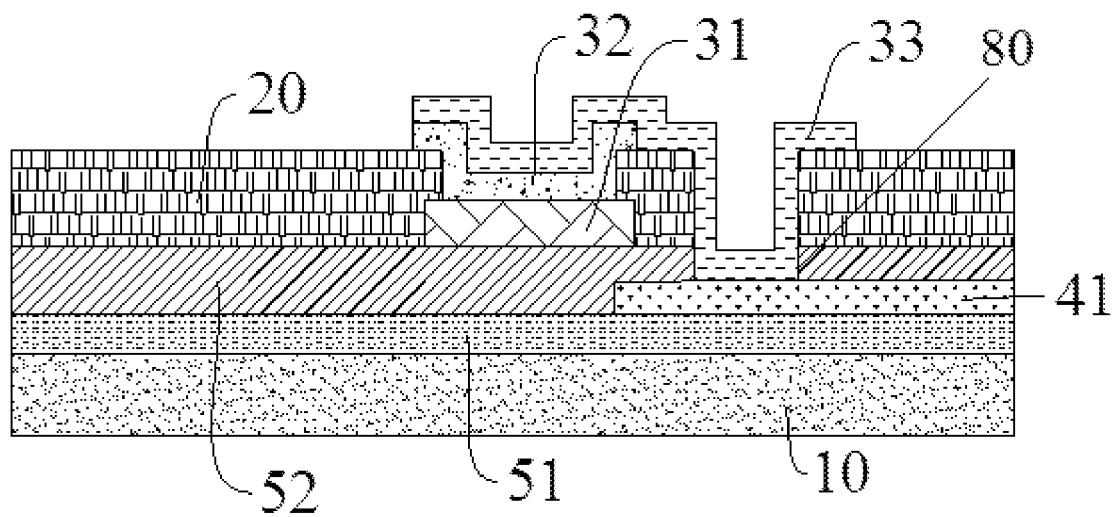
FIG. 2 illustrates a schematic structural view of a display panel according to an embodiment of the present disclosure.
Figure 3:
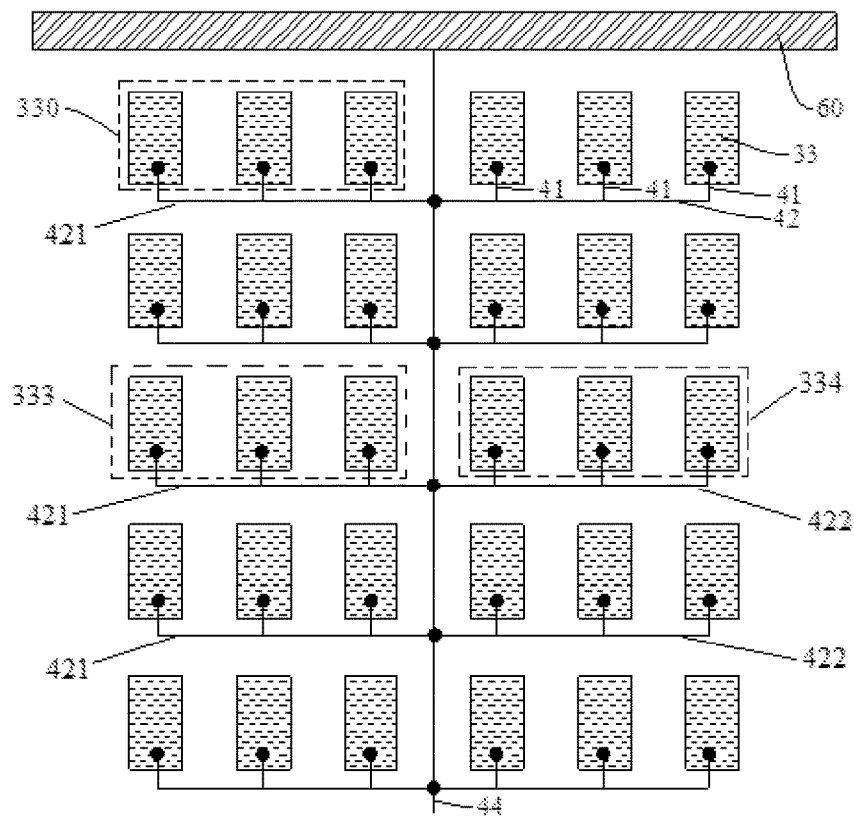
FIG. 3 illustrates a schematic plan view of a partial structure of a display panel according to another embodiment of the present disclosure.
Figure 4:
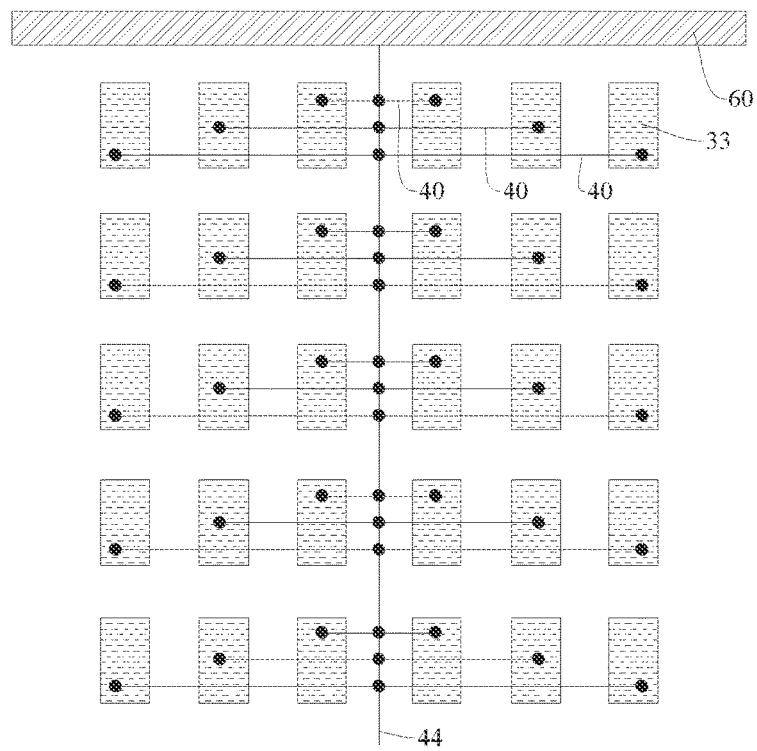
FIG. 4 illustrates a schematic plan view of a partial structure of a display panel according to still another embodiment of the present disclosure.

In an embodiment of the present disclosure, referring to FIGS. 1, 2 and 3 (wherein FIG. 3 illustrates a schematic view of a distribution of cathodes in the patterned area in FIG. 1), the display panel includes a substrate 10 and a plurality of OLEDs disposed on the substrate. Each OLED device includes an anode 31 and a light-emitting layer 32 that are stacked sequentially. The display panel further includes a patterned area 332. The patterned area 332 includes at least one cathode group 333 and 334, and each of the at least one cathode group includes a plurality of cathodes 33 arranged at intervals. An orthographic projection of each cathode 33 on the substrate 10 at least covers an orthographic projection of a light-emitting layer 21 of one OLED of the plurality of OLEDS on the substrate 10. For each of the at least one cathode group, the display panel further includes a plurality of first wirings 14 and a second wiring 42. Each cathode 33 of the cathode groups 330 is electrically connected to a corresponding first wiring 41, the second wiring 42 is electrically connected to the plurality of first wirings 41, and the second wiring 42 is electrically connected to a VSS signal line 44. Therefore, by arranging at least portion of the cathodes as a patterned cathode (that is, the display panel includes a patterned area), a light transmittance of the display panel at the patterned area can be greatly improved; moreover, through a second wiring connected to the plurality of first wirings corresponding to one cathode group, each cathode can be electrically connected to the VSS signal line. With respect to a connection manner in which each cathode is connected to the VSS signal line via an individual wiring (as illustrated in FIG. 4, in a direction away from a frame 60 in FIG. 4), IR drop on the VSS signal line gradually increases, and in a direction away from the VSS signal line 44, IR drop gradually increases), IR drop in the patterned area can be effectively decreased in the arrangement manner according to the embodiment of the present disclosure.

In an embodiment of the present disclosure, referring to FIG. 3, a plurality of cathodes 33 are arranged in array, and at least a part of the cathode 33 in each row (as illustrated in FIG. 3) or each column is defined as a cathode group 330. Therefore, the horizontal or vertical cathodes are connected through the first wiring and the second wiring, so as to reduce the IR drop of the cathodes. In some embodiments of the present disclosure, the VSS signal line 44 extends from the frame of the display panel and into an area in the display area corresponding to the patterned area. For multiple cathodes in the same row, they are arranged on both sides of the VSS signal line, the multiple cathodes 33 located on one side of the VSS signal line 44 are defined as a cathode group 330 and the multiple cathodes 33 located on the other side of the VSS signal line 44 are defined as a cathode group 330. The above wiring manner can reasonably lay out the plurality of first wiring lines and the plurality of second wiring lines.

In an embodiment of the present disclosure, the patterned area 332 may only be a local area of the display panel (as illustrated in FIG. 1), or alternatively, the patterned area 332 may be located in the entire display area of the display panel, that is, the cathodes of the OLEDS in the entire display area are patterned cathodes, which can be flexibly selected by one of ordinary skill in the art according to actual requirements.

Figure 5:
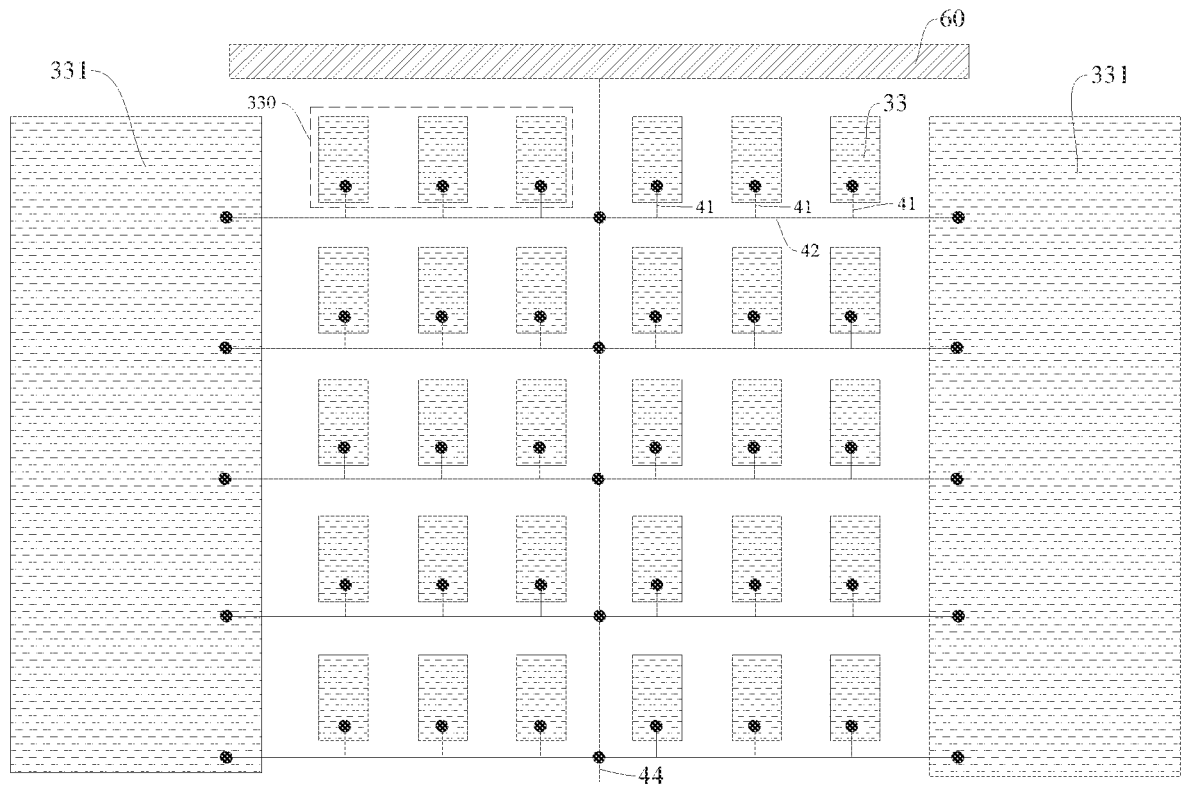
FIG. 5 illustrates a schematic plan view of a partial structure of a display panel according to yet another embodiment of the present disclosure.
Figure 6:
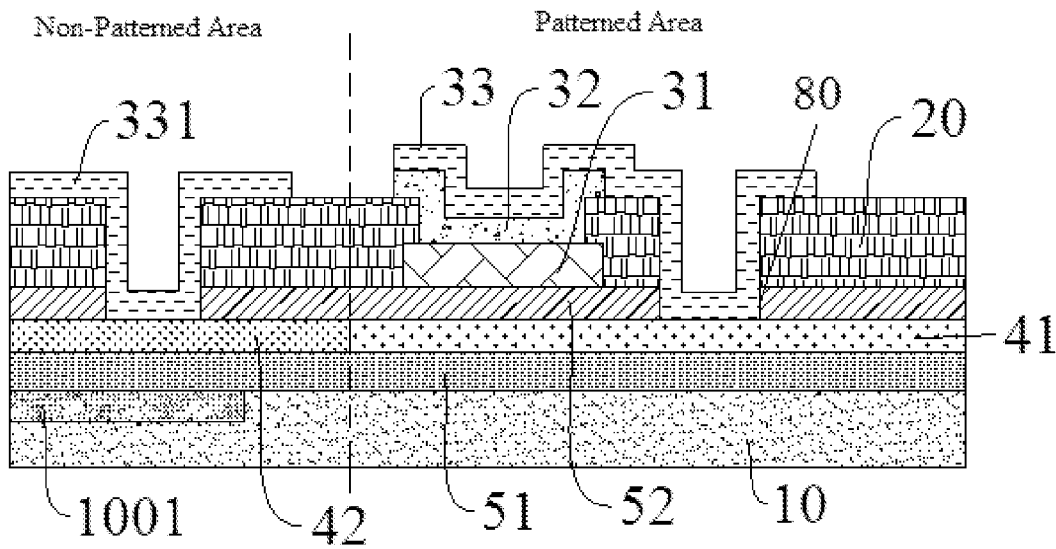
FIG. 6 illustrates a schematic structural view of a display panel according to still another embodiment of the present disclosure.

In an embodiment of the present disclosure, referring to FIGS. 5 and 6 (FIG. 6 illustrating a cross-sectional view of a part of the structure along the first wiring and the second wiring in FIG. 5), the display panel further includes a non-patterned area. The non-patterned area includes a plate cathode 331, and the second wiring 42 extends from the patterned area to the non-patterned area, and is electrically connected to the plate cathode 331. Thus, the electrical connection between the plate cathode 331 and the VSS signal line can be achieved, and furthermore, the arrangement manner that the plurality of second wirings 42 all extend to the non-patterned area and are electrically connected to the plate cathode 331 makes distribution of the second wirings more uniform, so that voltages of various OLED devices are more uniform, and voltages on the VSS signal line are more uniform; and the IR drop can be further reduced.

Figure 7:
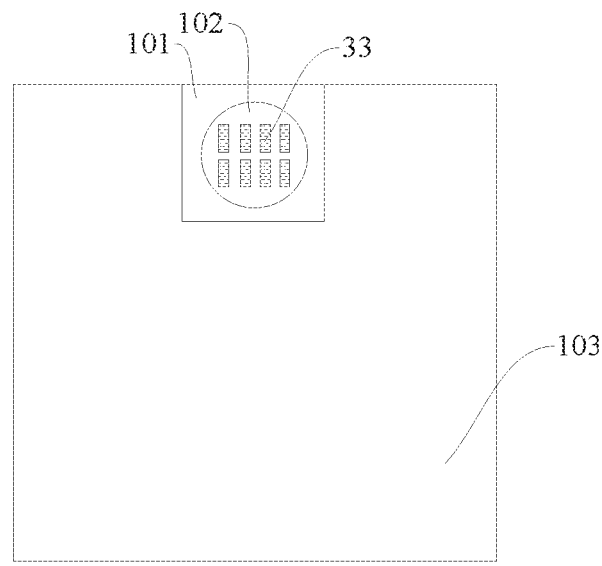
FIG. 7 illustrates a schematic plan view of divided areas of a display panel according to yet another embodiment of the present disclosure.

In an embodiment of the present disclosure, referring to FIG. 7, the display panel includes a first display area 101, a second display area 102, and a third display area 103, and the first display area 101 is arranged around the second display area 102, and the third display area 103 is arranged around the first display area 101. The patterned area is located in the second display area 102, and an under-screen camera is disposed in the second display area 102. That is, in the second display area 102, a cathode of a OLED device has a patterned cathode structure, including a plurality of cathodes 33 arranged at intervals, and cathodes of OLED devices in the first display area and the third display area are plate cathodes 331. As a result, for a display panel containing an under-screen camera, the light transmittance of the second display area corresponding to the under-screen camera can be effectively increased, thereby improving the shooting quality of the camera.

It should be noted that the first display area and the second display area are low pixel density areas relative to the pixel density (in pixels per inch (PPI)) of the third display area so as to improve the light transmission of the second display area rate, thereby guaranteeing the shooting quality of the under-screen camera. In addition, the cathode is a plate cathode 331 and is not patterned in the first display area and the third display area.

Shapes of the first display area and the second display area are not defined particularly, and one of ordinary skill in the art can make a selection flexibly according to actual requirements. For example, shapes of the first display area and the second display area may be circular, rectangular, elliptical or irregular shape, respectively. In addition, the first display area may be in contact with or not in contact with the frame area of the display panel, and one of ordinary skill in the art may make a design flexibly according to actual requirements.

In an embodiment of the present disclosure, referring to FIGS. 2 and 3, a first planarization layer 51 and a second planarization layer 52 are arranged between the substrate 10 and the OLED device, wherein the second planarization layer 52 is arranged adjacent to the OLED, both the first wiring 41 and the second wiring 42 are disposed between the first planarization layer 51 and the second planarization layer 52, and the cathode 33 is electrically connected to the first wiring 41 via a through hole 80 passing through the second planarization layer 52, wherein the first wiring and the second wiring are both transparent wiring. Therefore, compared to the electrical connection to the VSS signal line via the wiring disposed on same layer as the anode (typically made of ITO/Ag/ITO), the transparent first wiring 41 and the transparent second wiring 42 provide the electrical connection with the VSS signal line 44 in the present disclosure, the light transmittance of the display panel can be further increased, and the shooting quality of the under-screen camera can be further improved.

Figure 8:
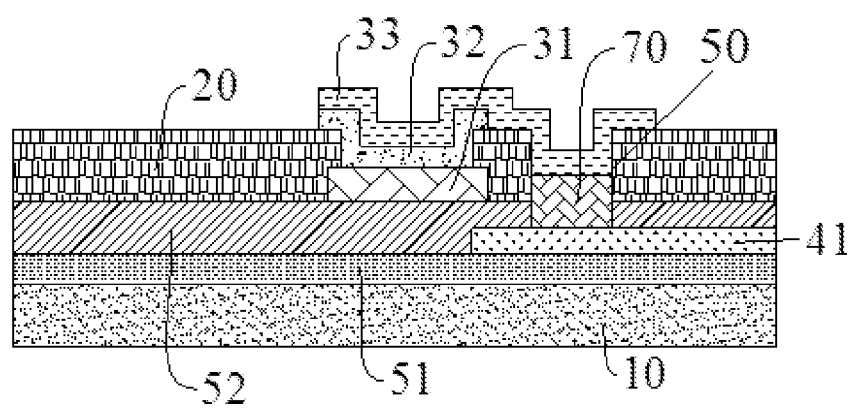
FIG. 8 illustrates a schematic structural view of a display panel according to still another embodiment of the present disclosure.

In an embodiment of the present disclosure, referring to FIG. 8, the display panel further includes a pixel definition layer 20 disposed on a surface of the second planarization layer 52 away from the substrate 10. The pixel definition layer 20 is provided with a plurality of openings. The plurality of OLED devices are provided in the openings respectively, and at least portion of the cathode 33 covers a surface of the pixel definition layer 20. The display panel further includes a through hole 50 and a conductive connection layer 70. The through hole 50 passes through the second planarization layer 52 and the pixel definition layer 20, the through hole 50 exposes at least portion of a surface of the first trace 41, and the conductive connection layer 70 is disposed in the through hole 50 and is electrically connected to the first Wire 41 and to the cathode 33. Therefore, the provision of the conductive connection layer 70 can reduce a drop height of the cathode in the through hole, thereby improving reliability of the cathode.

In an embodiment of the present disclosure, the conductive structure layer 70 may be disposed in same layer as the anode, that is, the conductive structure layer and the anode are formed by a single process.

In the present disclosure, the term "disposed in same layer" means that two or more structures are formed of a same material and formed by a single patterning process. A patterning process refers to, forming a material film, and after that, coating photoresist on the material film, exposing and developing the photoresist through a mask, and then using the developed photoresist as a mask, etching the material film to form a desired pattern, and then, removing the developed photoresist.

Figure 9:
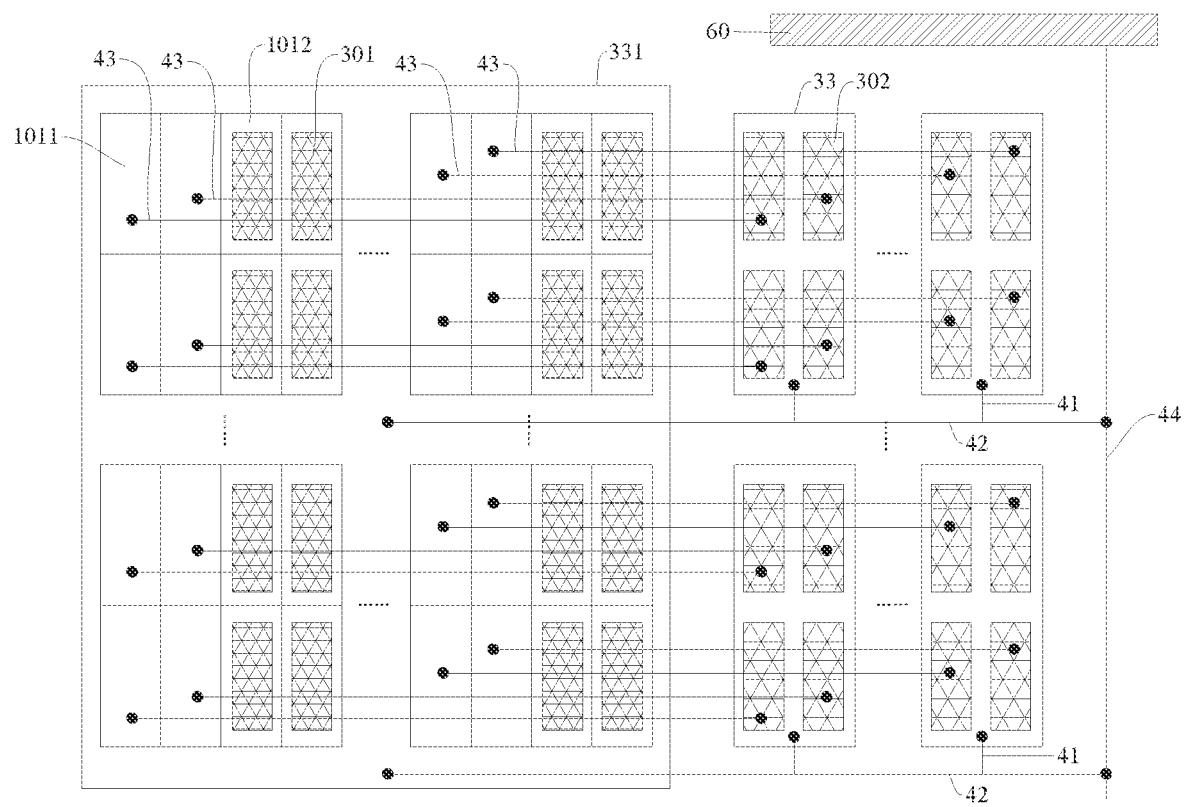
FIG. 9 illustrates a schematic plan view of a partial structure of a display panel according to yet another embodiment of the present disclosure.
Figure 10:
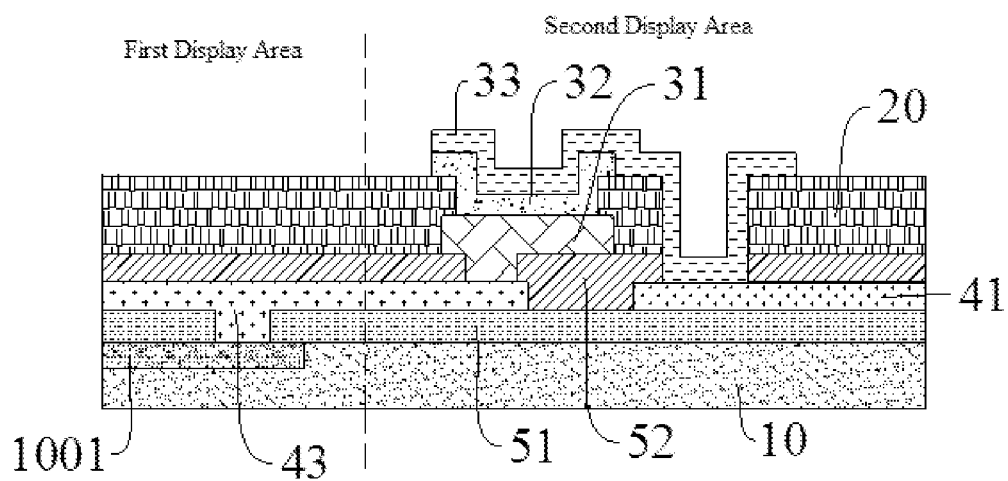
FIG. 10 illustrates a schematic structural view of a display panel according to still another embodiment of the present disclosure.

In an embodiment of the present disclosure, referring to FIG. 9 (FIG. 9 illustrating one cathode 33 covering four OLED devices as an example) and FIG. 10, the first display area 101 includes a first pixel unit 1011 and a second pixel unit 1012, the first pixel unit 1011 is provided with a first pixel circuit (and no OLED device is provided in the first pixel unit 1011), and the second pixel unit 1012 is provided with a second pixel circuit and a first OLED device 301; the second display area 102 is provided with a second OLED device 302 (but the second display area is not provided with a pixel circuit). For each second OELD device, the display panel further includes a third wiring 43, which is configured to electrically connect a drain electrode 1101 of the first pixel circuit of an anode 31 of the second OLED device 302, so as to drive the second OLED device 302 to emit light. Therefore, no pixel circuit is provided in the second display area, which can further increase the light transmittance of the second display area, and the second OLED device in the second display area is driven to emit light by the first pixel circuit disposed in the first display area, display effect of the second display area will not be affected.

In an embodiment of the present disclosure, the first pixel unit 1011 to which the first pixel circuit connected by one third wire belongs and a pixel unit to which the second OLED device connected by the one third wire belongs are arranged in the same row, which is beneficial to arrangement of the plurality of third wires.

In an embodiment of the present disclosure, the third wires are all transparent wires, and the second wires and the third wires are disposed in same layer and are not connected to each other. As a result, the light transmittance of the display panel can be further improved, and the manufacturing process can be simplified, and the cost can be saved.

There are no requirements for materials of the first, second and third wirings, as long as they are transparent. In some embodiments of the present disclosure, the materials of the first wiring, the second wiring, and the third wiring include, but are not limited to, ITO (Indium Tin Oxide) or AZO (Aluminum Doped Zinc Oxide).

In an embodiment of the present disclosure, referring to FIGS. 3 and 5, the VSS signal line 44 extends from the frame 60 of the display panel and extends into the second display area 102, and is located on a middle line of the second display area 102. A plurality of cathodes 33 are arranged on a first side and a second side of the VSS signal line 44, thereby forming a first cathode group 333 disposed on the first side and a second cathode group 334 disposed on the second side. The second wiring 42 includes a first portion and a second portion, the first portion includes a plurality of first branches 421 disposed on a first side of the VSS signal line 44 and arranged at intervals in a direction parallel to the VSS signal line 44, and a plurality of second branches 422 disposed on a second side of the VSS signal line 44 and arranged at intervals in the direction parallel to the VSS signal line 44. Each of the first branches 421 is electrically connected to a plurality of first wirings 41 disposed on the first side and connecting to cathodes of the first cathode group, and each of the second branches 422 is electrically connected to the plurality of first wirings 41 disposed on the second side and connecting to cathodes of the second cathode group. In some embodiments of the present disclosure, the plurality of cathodes in the second display area may be evenly distributed on both sides of the VSS signal line, so that the first wirings, the second wirings, and the third wirings on both sides of the VSS signal line are arranged symmetrically about the VSS signal line respectively.

In an embodiment of the present disclosure, the VSS signal line 44 may be disposed in same layer as the drain electrode 1001 of the pixel circuit (that is, formed with the drain electrode 1001 by a single process); in another embodiment of the present disclosure, the VSS signal line may is disposed in same layer as the anode of the OLED device (that is, formed with the anode in a single process).

At least one embodiment of the present disclosure provides a display device. According to an embodiment of the present disclosure, the display device includes the display panel as described above. Therefore, the display device not only has higher light transmittance, but also has a smaller voltage drop on the cathode of the OLED device, which can effectively improve the display quality of the display device. One of ordinary skill in the art can understand that the display device has all the features and advantages of the display panel as described, and will not be elaborated here.

In an embodiment of the present disclosure, a type of the display device has no special requirements, and one of ordinary skill in the art can flexibly choose the type according to actual situations. In some embodiments of the present disclosure, the display device includes, but is not limited to, display devices such as mobile phones, iPads, and notebooks.

One of ordinary skill in the art can understand that in addition to the display panel described above, the display device also includes necessary structures or components of a conventional display device. Taking a mobile phone as an example, in addition to the display panel as described, the display device also includes a touch module, a fingerprint module, an audio module, a CPU, a housing and other structures or components.

The terms "first" and "second" in the text are only used for descriptive purposes, and cannot be understood as indicating or implying relative importance or implicitly indicating the number of indicated technical features. Thus, the features defined with "first" and "second" may explicitly or implicitly include one or more of these features. In the description of the present disclosure, "plurality" means two or more than two, unless specifically stated otherwise.

In the present disclosure, unless expressly stated and defined otherwise, the first feature "on" or "under" the second feature may be in direct contact with the first and second features, or the first and second features may indirectly contact through an intermediary. Moreover, a first feature disposed "on", "above" and "over" a second feature may mean that the first feature is directly above or obliquely above the second feature, or may simply mean that a level of the first feature is higher than that of the second feature. The first feature disposed "under", "below" and "beneath" the second feature may mean that the first feature is directly below or obliquely below the second feature, or may simply mean that a level of the first feature is lower than that of the second feature.

In the description of this specification, descriptions with reference to the terms "an embodiment", "some embodiments", "examples", "specific examples", or "some examples" etc. mean that specific features, structures, materials, or characteristics described in conjunction with the embodiment or example are included in at least one embodiment or example of the present disclosure. In the specification of the present disclosure, schematic representations of the above terms do not necessarily refer to the same embodiment or example. Moreover, the described extract features, structures, materials or characteristics can be combined in any one or more embodiments or examples in a suitable manner, in addition, one of ordinary skill in the art can combine and combine various embodiments or examples and features of various embodiments or examples described in the specification without contradicting each other.

Although the embodiments of the present disclosure have been illustrated and described above, it can be understood that the above-mentioned embodiments are exemplary and should not be construed as a limit to the present disclosure. One of ordinary skill in the art can make changes, modifications, substitutions, and variants to the foregoing embodiments without departing the protection scope of the present disclosure.

The invention claimed is:

1. A display panel, comprising:
a substrate; and
a plurality of OLED devices disposed on the substrate, each of the plurality of OLED devices comprising an anode and a light-emitting layer arranged in stack;
wherein the display panel further comprises a patterned area, the patterned area comprising at least one cathode group, each of the at least one cathode group comprising a plurality of cathodes arranged at intervals, and an orthographic projection of each of the plurality of cathodes on the substrate at least covers an orthographic projection of the light-emitting layer of one of the plurality of OLED devices on the substrate; and
for each of the at least one cathode group, the display panel further comprises a plurality of first wirings and a second wiring, the plurality of first wirings are electrically connected to the plurality of cathodes in one-to-one correspondence, and the second wiring is electrically connected to the plurality of first wirings and electrically connected to a VSS signal line.

2. The display panel according to claim 1, wherein the plurality of cathodes of each of the at least one cathode group are arranged in a row or a column.

3. The display panel according to claim 1, wherein the display panel further comprises a non-patterned area, the non-patterned area comprises a plate cathode, and the second wiring extends from the patterned area to the non-patterned area and is electrically connected to the plate cathode.

4. The display panel according to claim 1, further comprising a first display area, a second display area, and a third display area, the first display area disposed around the second display area, and the third display area disposed around the first display area;
wherein the patterned area is disposed in the second display area.

5. The display panel according to claim 4, wherein the first display area comprises a first pixel unit provided with a first pixel circuit, and the plurality of OLED devices are disposed in the second display area, and for each of the plurality of OLED devices, the display panel further comprises: a third wiring configured to electrically connect a drain electrode of the first pixel circuit and the anode of the OLED device, so as to drive the OLED device to emit light.

6. The display panel according to claim 5, wherein the third wiring is a transparent wiring, and the second wiring and the third wiring are disposed in same layer.

7. The display panel according to claim 5, wherein the VSS signal line is located on a middle line of the second display area, the at least one cathode group comprises at least one first cathode group disposed on a first side of the VSS signal line and at least one second cathode group disposed on a second side of the VSS signal line, the second wiring comprises a first portion disposed on the first side of the VSS signal line and a second portion disposed on the second side of the VSS signal line, the first portion comprises a plurality of first branches arranged at intervals in a direction parallel to the VSS signal line, each of the plurality of first branches is electrically connected to the plurality of first wirings corresponding to one of the at least one first cathode group, the second portion comprises a plurality of second branches arranged at intervals in the direction parallel to the VSS signal line, and each of the plurality of second branches is electrically connected to the plurality of first wirings corresponding to one of the at least one second cathode group.

8. The display panel according to claim 1, further comprising a first planarization layer and a second planarization layer, the first planarization layer and the second planarization layer disposed between the substrate and the plurality of OLED devices, wherein the second planarization layer is disposed adjacent to the plurality of OLEDs, the plurality of first wirings and the second wiring are both disposed between the first planarization layer and the second planarization layer, each of the plurality of cathodes is electrically connected to the first wiring via a via hole passing through the second planarization layer.

9. The display panel according to claim 8, further comprising:
- a pixel definition layer disposed on a surface of the second planarization layer away from the substrate, wherein the pixel definition layer is provided with a plurality of openings, and the plurality of OLED devices are arranged in the plurality of openings in one-to-one correspondence, and at least part of each of the plurality of cathodes covers the surface of the pixel definition layer;
- a through hole passing through the second planarization layer and the pixel definition layer and at least exposing a part of the surface of the first wiring; and
- a conductive connection layer disposed in the through hole and contacting and connecting with the first wiring and the cathode respectively.

10. The display panel according to claim 2, wherein the display panel further comprises a non-patterned area, the non-patterned area comprises a plate cathode, and the second wiring extends from the patterned area to the non-patterned area and is electrically connected to the plate cathode.

11. The display panel according to claim 2, further comprising a first display area, a second display area, and a third display area, the first display area disposed around the second display area, and the third display area disposed around the first display area;
wherein the patterned area is disposed in the second display area.

12. The display panel according to claim 2, wherein a pixel density of the first display area is less than a pixel density of the third display area, and a pixel density of the second display area is less than the pixel density of the third display area.

13. The display panel according to claim 11, wherein the first display area comprises a first pixel unit provided with a first pixel circuit, and the plurality of OLED devices are disposed in the second display area, and for each of the plurality of OLED devices, the display panel further comprises: a third wiring configured to electrically connect a drain electrode of the first pixel circuit and the anode of the OLED device, so as to drive the OLED device to emit light.

14. The display panel according to claim 13, wherein the third wiring is a transparent wiring, and the second wiring and the third wiring are disposed in same layer.

15. The display panel according to claim 14, wherein a material of the first wiring comprises at least one of Indium Tin Oxide and Aluminum Doped Zinc Oxide.

16. The display panel according to claim 13, wherein the VSS signal line is located on a middle line of the second display area, the at least one cathode group comprises at least one first cathode group disposed on a first side of the VSS signal line and at least one second cathode group disposed on a second side of the VSS signal line, the second wiring comprises a first portion disposed on the first side of the VSS signal line and a second portion disposed on the second side of the VSS signal line, the first portion comprises a plurality of first branches arranged at intervals in a direction parallel to the VSS signal line, each of the plurality of first branches is electrically connected to the plurality of first wirings corresponding to one of the at least one first cathode group, the second portion comprises a plurality of second branches arranged at intervals in the direction parallel to the VSS signal line, each of the plurality of second branches is electrically connected to the plurality of first wirings corresponding to one of the at least one second cathode group.

17. The display panel according to claim 2, further comprising a first planarization layer and a second planarization layer, the first planarization layer and the second planarization layer disposed between the substrate and the plurality of OLED devices, wherein the second planarization layer is disposed adjacent to the plurality of OLEDs, the plurality of first wirings and the second wiring are both disposed between the first planarization layer and the second planarization layer, each of the plurality of cathodes is electrically connected to the first wiring via a via hole passing through the second planarization layer.

18. The display panel according to claim 17, further comprising:
- a pixel definition layer disposed on a surface of the second planarization layer away from the substrate, wherein the pixel definition layer is provided with a plurality of openings, and the plurality of OLED devices are arranged in the plurality of openings in one-to-one correspondence, and at least part of each of the plurality of cathodes covers the surface of the pixel definition layer;
- a through hole passing through the second planarization layer and the pixel definition layer and at least exposing a part of the surface of the first wiring; and
- a conductive connection layer disposed in the through hole and contacting and connecting with the first wiring and the cathode respectively.

19. A display device, comprising the display panel according to claim 1.

20. The display device according to claim 19, further comprising an under-screen camera disposed in the patterned area.

* * * * *